US006794110B2

(12) United States Patent
Breyta et al.

(10) Patent No.: US 6,794,110 B2
(45) Date of Patent: Sep. 21, 2004

(54) POLYMER BLEND AND ASSOCIATED METHODS OF PREPARATION AND USE

(75) Inventors: Gregory Breyta, San Jose, CA (US); Hiroshi Ito, San Jose, CA (US); Hoa D. Truong, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 298 days.

(21) Appl. No.: 10/090,646

(22) Filed: Mar. 4, 2002

(65) Prior Publication Data

US 2003/0171490 A1 Sep. 11, 2003

(51) Int. Cl.[7] .......................... G03F 7/004; C08F 36/00

(52) U.S. Cl. ................... 430/270.1; 430/325; 430/326; 430/907; 526/281; 526/242; 526/232.1; 526/219.6; 526/332

(58) Field of Search ............................... 430/270.1, 325, 430/326, 905, 907; 526/219.6, 232.1, 332, 281

(56) References Cited

U.S. PATENT DOCUMENTS

| 6,579,658 B2 * | 6/2003 | Hatakeyama et al. .... 430/270.1 |
| 2002/0009668 A1 | 1/2002 | Nishimura et al. |
| 2002/0102490 A1 | 8/2002 | Ito et al. |
| 2002/0146638 A1 | 10/2002 | Ito et al. |
| 2002/0146639 A1 | 10/2002 | Brock et al. |

FOREIGN PATENT DOCUMENTS

EP        1164434 A2     12/2001

OTHER PUBLICATIONS

U.S. patent application Ser. No. 09/886,428, Li, filed Jun. 21, 2001.
Chiba et al. (2000), "157 nm Resist Materials: A Progress Report," *Journal of Photopolymer Science and Technology* 13(4):657–664.
Fender et al. (2001), "Characterization of New Aromatic Polymers for 157 nm Photoresist Applications," *Advances in Resist Technology and Processing XVIII, Proceedings of SPIE* 4345:417–427.
Ito et al. (1998), "Synthesis and Evaluation of Alicyclic Backbone Polymers for 193 nm Lithography," *Micro– and Nanopatterning Polymers, ACS Symposium Series* 706:208–223 (214th ACS National Meeting, Las Vegas, NV, Sep. 7–11, 1997).
Ito et al. (2001), "Polymer Design for 157 nm Chemically Amplified Resists," *Advances in Resist Technology and Processing XVIII, Proceedings of SPIE* 4345:273–284.
Ito et al. (2001), "Novel Fluoropolymers for Use in 157 nm Lithography," *Journal of Photopolymer Science and Technology* 14(4):583–594.

* cited by examiner

*Primary Examiner*—Rosemary Ashton
(74) *Attorney, Agent, or Firm*—Dianne E. Reed; Reed & Eberle LLP (57) ABSTRACT

A polymer blend is provided for use in a lithographic photoresist composition, particularly a chemical amplification photoresist. In a preferred embodiment, the polymer blend is substantially transparent to deep ultraviolet radiation, i.e., radiation of a wavelength less than 250 nm, including wavelengths of 157 nm, 193 nm and 248 nm, and has improved sensitivity and resolution. Processes for preparing and using the polymer blend are also provided, as are lithographic photoresist compositions that contain the polymer blend.

59 Claims, 4 Drawing Sheets

POLYMER BLEND AND ASSOCIATED METHODS OF PREPARATION AND USE

TECHNICAL FIELD

This invention relates generally to the fields of lithography and semiconductor fabrication. More particularly, the invention relates to the use of certain novel polymer blends that are especially useful in photoresist compositions, including ultraviolet, electron-beam, and x-ray photoresists.

BACKGROUND

There is an ongoing need in the electronics industry for increasingly higher circuit densities in microelectronic devices made using lithographic techniques. One method of increasing the number of components per integrated circuit ("chip") is to decrease the minimum feature size on the chip, which requires higher lithographic resolution. This decrease in feature size has been accomplished over the past twenty years by reducing the wavelength of the imaging radiation from the visible (436 nm) down through the ultraviolet (365 nm) to the deep ultraviolet (DUV; <248 nm). Development of commercial lithographic processes using ultra-deep ultraviolet radiation, particularly at 193 nm or 157 nm, is now of increasing interest. See, for example, Allen et al. (1995), "Resolution and Etch Resistance of a Family of 193 nm Positive Resists," *J. Photopolym. Sci. and Tech.* 8(4): 623–636, and Abe et al. (1995), "Study of ArF Resist Material in Terms of Transparency and Dry Etch Resistance," *J. Photopolym. Sci. and Tech.* 8(4):637–642.

Attempts have been made to develop 157 nm resists, for example by using heavily fluorinated materials such as polytetrafluoroethylene (e.g., Teflon AF®; see Endert et al. (1999), *Proc. SPIE-Int. Soc. Opt. Eng,* 3618:413–17) or hydridosilsesquioxanes (see U.S. Pat. No. 6,087,064 to Lin et al.). These materials do not, however, have reactivity or solubility characteristics suitable for lithographic manufacturing processes. The challenge in producing chemically amplified resists for 157 nm lithography is to achieve suitable transparency at this wavelength in polymers that have acid-labile functionalities, and that can be developed with industry-standard developers in either exposed or unexposed areas depending on whether the resist is positive or negative.

Homo- and copolymers of methyl α-trifluoromethylacrylate (MTFMA) and its derivatives have been found to be surprisingly transparent at 157 nm, with an optical density (OD) of less than $3/\mu m$, whereas poly(methyl methacrylate) (PMMA) is highly absorbing (OD=$6/\mu m$) (see, for example, Ito et al. (2001), "Polymer Design for 157 nm Chemically Amplified Resists," *Proc. SPIE* 4345: 273–284; Ito et al. (2001) "Novel Fluoropolymers for Use in 157 nm Lithography," *J. Photopolym. Sci. Technol.* 14:583–593, and Chiba et al. (2000), "157 nm Resist Materials: a Progress Report," *J. Photopolym. Sci. Technol* 13:657–664.)

Unfortunately, MTFMA and its derivatives do not readily undergo radical homopolymerization, and polymers can be made only by anionic polymerization (see Ito et al. (1981), "Methyl α-Trifluoroacrylate, an E-Beam and UV Resist," IBM Technical Disclosure Bulletin 24(2): 991). Although MTFMA-methacrylate copolymers using anionic polymerization are highly useful as 157 nm resist polymers, it is still desirable to identify comonomers that polymerize with α-trifluoromethylacrylic monomers by radical initiation. Radical polymerization is easy to run and economical, and is a preferred process for preparation of resist polymers.

Several polymers have now been identified as suitable components of 157 nm resist polymers. For example, copolymers of t-butyl-α-trifluoromethylacrylate (TBTFMA) and bicyclo[2.2.1]hept-5-ene-2-(1,1,1-trifluoro-2-trifluoromethylpropan-2-ol) (NBHFA) have been shown to be particularly suitable. See, for example, Ito et al. (2001) *Proc. SPIE* 4345: 273–284, supra; Ito et al. (2001) *J. Photopolym. Sci. Technol.* 14:583–593, supra, and Chiba et al. (2000), supra. As norbornene copolymers based on NBHFA are made by metal-mediated addition polymerization, copolymers that can be readily prepared via a conventional radical mechanism have also been sought. Unfortunately, it is difficult to incorporate more than 50 mol % NBHFA in the copolymer, and the OD of P(TBTFMA-NBHFA) ranges from 3.2 to $2.7/\mu m$, depending on the molecular weight (see the aforementioned references).

Although the lowest OD achieved with P(TBTFMA-NBHFA) may be adequate for some purposes, it is still desirable to increase the transparency of the polymer for 157 nm applications. Furthermore, resist polymers must possess many properties in addition to good transparency at the exposure wavelength. In fact, the ability of the resist polymer to be developed in aqueous base is critically important in generating high-resolution images. Unfortunately, however, resists based on copolymers such as poly (TBTFMA-co-NBHFA) do not develop well in aqueous base due to their low hydrophilicity.

SUMMARY OF THE INVENTION

While two different polymers do not, in general, mix homogeneously, it has now been discovered and is herein disclosed that certain copolymers—such as the TBTFMA-NBHFA copolymer, copolymers of (4-(1-hydroxy-2,2,2-trifluoro-1-trifluoromethyl)ethylstyrene) (STHFA) with t-butyl methacrylate (TBMA) (PF-ESCAP) and with TBT-FMA ($PF^2$-ESCAP), and certain TBTFMA-vinyl ether copolymers—are capable of blending substantially homogeneously with other polymers, such as a homopolymer of NBHFA (PNBHFA). The blending of a lipophilic copolymer with a transparent, hydrophilic polymer improves aqueous base development and increases transparency, to allow for the generation of high-resolution images.

Accordingly, it is a primary object of the invention to address the above-described need in the art by providing a substantially homogeneous polymer blend that is suitable for use in lithographic photoresist compositions.

It is another object of the invention to provide a lithographic photoresist composition containing a substantially homogeneous polymer blend.

It is still another object of the invention to provide a method for generating a resist image on a substrate using a photoresist composition as described herein.

It is a further object of the invention to provide a method for forming a patterned structure on a substrate by transferring the aforementioned resist image to the underlying substrate material, e.g., by etching.

It is still a further object of the invention to provide a method of preparing a copolymer suitable for use in lithographic photoresist compositions.

Additional objects, advantages and novel features of the invention will be set forth in part in the description that follows, and in part will become apparent to those skilled in the art upon examination of the following, or may be learned by practice of the invention.

In one aspect of the invention a substantially homogeneous polymer blend comprising a first polymer and second polymer is provided. Alternatively, a third polymer may be included in the blend. The first polymer is comprised of monomer units having the structure of formula (I):

(I)

wherein $R^1$ is $C_{1-12}$ alkyl or $C_{1-12}$ fluoroalkyl, $R^2$ is $C_{1-12}$ fluoroalkyl, and L is $C_{1-6}$ alkylene or $C_{1-6}$ fluoroalkylene. In preferred embodiments, the second polymer is a copolymer comprising:

a first monomer unit having the structure of formula (II):

(II)

wherein $R^3$ is H, F, CN, $CH_3$ or $C_{1-6}$ fluoroalkyl (with fluorinated methyl groups, i.e., $CF_2H$, $CFH_2$, and $CF_3$, being preferred $C_{1-6}$ fluoroalkyl substituents), $R^{4a}$ and $R^{4b}$ are H or F, and $R^5$ is CN or COOR, wherein R is selected from the group consisting of H, $C_{1-12}$ alkyl, and $C_{1-12}$ fluoroalkyl, or is selected so as to render $R^5$ acid-cleavable; and a second monomer unit selected from the group consisting of:

wherein in formulae (I) and (IV), $R^1$, $R^2$, and L are as defined previously, and in formula (III), $R^6$ is H, $C_{1-12}$ alkyl, $C_{1-12}$ fluoroalkyl, $C_{3-15}$ alicyclic, or fluorinated $C_{3-15}$ alicyclic, $R^7$ is $C_{1-12}$ alkyl $C_{1-12}$ alkyl substituted with 1–12 fluorine atoms and 0–2 hydroxyl groups, $C_{3-15}$ alicyclic, or fluorinated $C_{3-15}$ alicyclic, or $R^6$ and $R^7$ together form a five-, six-, or seven-membered ring, $R^8$ is H, $C_{1-12}$ alkyl, or $C_{1-12}$ fluoroalkyl, and $R^9$ is H, $C_{1-12}$ alkyl, or $C_{1-12}$ fluoroalkyl, or $R^7$ and $R^9$ together represent $—X—(CR^{10}R^{11})_n—$, in which case $R^6$ and $R^8$ are H, X is O or $CH_2$, n is 1 or 2, and $R^{10}$ and $R^{11}$ are H, $C_{1-12}$ alkyl, or $C_{1-12}$ fluoroalkyl, or together form an oxo moiety (=O). When such an oxo moiety is present, n is 1. As an alternative to the aforementioned definitions of $R^6$ and $R^8$, the two substituents together form a five-, six- or seven-membered ring. Further, any carbon atoms indicated in the structures as unsubstituted may in fact be substituted with one or more inert, nonhydrogen substituents such as, for the alicyclic groups (see formula I), F, or $C_{1-6}$ fluoroalkyl (preferably fluorinated methyl, ie., $CFH_2$, $CHF_2$ or $CF_3$), and for the benzene ring (see formula IV), F, $C_{1-12}$ alkyl, $C_{1-12}$ alkoxy, $C_{2-12}$ alkenyl, $C_{2-12}$ alkenyloxy, $C_{1-12}$ fluoroalkyl, $C_{1-12}$ fluoralkoxy, and $C_{2-12}$ fluoroalkenyl, wherein any of the afornentioned substituents, with the exception of F, may be further substituted with additional moieties, e.g., hydroxyl groups.

The substantially homogeneous blend may serve either as the base-soluble component of an unexposed resist, or as an acid-labile material (e.g., as a result of containing acid-cleavable pendent groups such as acid-cleavable esters) that releases acid following irradiation as a result of the photo-acid generator in the resist composition.

Another embodiment of the invention provides a photoresist composition comprised of the substantially homogeneous polymer blend described above and a photoacid generator.

The present invention also relates to the use of the photoresist composition in a lithography method. The process involves: (a) coating a substrate (e.g., a ceramic, metal, or semiconductor substrate) with a film comprising a radiation-sensitive acid generator and a copolymer as provided herein; (b) exposing the film selectively to a predetermined pattern of radiation to form a latent image therein; and (c) developing the image using a suitable developer composition. The radiation may be ultraviolet, electron beam, or x-ray. Ultraviolet radiation is preferred, particularly deep ultraviolet radiation having a wavelength of less than about 250 nm (e.g., 157 nm, 193 nm, or 248 nm). The pattern from the resist structure may then be transferred to the underlying substrate. Typically, the transfer is achieved by reactive ion etching or by an alternative etching technique. Thus, the compositions of the invention and resulting resist structures can be used to create patterned material layer structures, such as metal wiring lines, holes for contacts or vias, insulation sections (e.g., damascene trenches for shallow trench isolation), trenches for capacitor structures, etc., as might be used in the design of integrated circuit devices.

Additionally, the invention relates to a method for improving the aqueous base development of a lithographic photoresist composition comprising a polymer transparent to deep ultraviolet radiation and a radiation-sensitive acid generator, wherein the improvement comprises incorporating into the lithographic photoresist composition an additional polymer comprised of a monomer unit having the structure of formula (I).

The invention also relates to a method for reducing the optical absorption in the vacuum ultraviolet region of a lithographic photoresist composition comprising a polymer transparent to deep ultraviolet radiation and a radiation-sensitive acid generator, wherein the improvement comprises incorporating into the lithographic photoresist composition an additional polymer comprised of a monomer unit having the structure of formula (I).

In another embodiment of the invention, a method is provided for preparing the preferred copolymer comprised of a first monomer unit having the structure of formula (II) and a second monomer unit having a structure selected from formulae (I), (III), and (IV). The method involves copolymerizing, via direct free radical polymerization (e.g., bulk free radical polymerization) in the presence of a free radical initiator, a first monomer having the structure of formula (V):

wherein $R^3$, $R^{4a}$, $R^{4b}$, and $R^5$ are as described above and a second monomer having the structure wherein $R^1$, $R^2$, and L are as described above. Additional monomers such as those having the structure of formula (VII) or formula (VIII):

wherein $R^1$, $R^2$, $R^6$, $R^7$, $R^8$, and $R^9$ are as defined above, may also be incorporated into the copolymer. Again, any of the unsubstituted carbon atoms shown in the above molecular structures may be substituted with one or more inert, non-hydrogen substituents as described earlier.

DETAILED DESCRIPTION OF THE DRAWINGS

DETAILED DESCRIPTION OF THE INVENTION

Definitions and Nomenclature

Before describing the present invention in detail, it is to be understood that unless otherwise indicated this invention is not limited to specific compositions, components, or process steps, as such may vary. It is also to be understood that the terminology used herein is for the purpose of describing particular embodiments only, and is not intended to be limiting.

It must be noted that, as used in this specification and the appended claims, the singular forms "a," "an," and "the" include plural referents unless the context clearly dictates otherwise. Thus, for example, reference to "a monomer" includes not only a single monomer but also a combination of two or more monomers that may or may not be the same, a "photoacid generator" includes a mixture or combination of two or more photoacid generators as well as a single photoacid generator, and the like.

In describing and claiming the present invention, the following terminology will be used in accordance with the definitions set out below.

The term "alkyl" as used herein refers to a branched, unbranched or cyclic saturated hydrocarbon group of 1 to 24 carbon atoms, preferably 1 to 12 carbon atoms, such as methyl, ethyl, n-propyl, isopropyl, n-butyl, isobutyl, t-butyl, octyl, decyl, tetradecyl, hexadecyl, eicosyl, tetracosyl, and the like, as well as cycloalkyl groups such as cyclopentyl, cyclohexyl, and the like. The term "lower alkyl" refers to an alkyl group of 1 to 6 carbon atoms, and the term "lower alkyl ester" refers to an ester functionality —C(O)O—R, wherein R is lower alkyl.

The term "alkylene" as used herein refers to a difunctional saturated branched or unbranched hydrocarbon chain containing from 1 to 24 carbon atoms, preferably 1 to 12 carbon atoms, and includes, for example, methylene (—CH$_2$—), ethylene (—CH$_2$—CH$_2$—), propylene (—CH$_2$—CH$_2$—CH$_2$—), 2-methylpropylene (—CH$_2$—CH(CH$_3$)—CH$_2$—), hexylene (—(CH$_2$)$_6$—), and the like.

The term "alkenyl" as used herein refers to a branched, unbranched or cyclic unsaturated hydrocarbon group of 2 to 24 carbon atoms, preferably 2 to 12 carbon atoms, and containing at least one double bond. Such groups include, for example, ethenyl, n-propenyl, isopropenyl, n-butenyl, isobutenyl, octenyl, decenyl, tetradecenyl, hexadecenyl, eicosenyl, tetracosenyl, and the like. The term "lower alkenyl" refers to an alkenyl group of 1 to 6 carbon atoms.

The term "alkoxy" as used herein intends an alkyl group bound through a single, terminal ether linkage; that is, an "alkoxy" group may be represented as —O-alkyl where alkyl is as defined above. A "lower alkoxy" group intends an alkoxy group containing 1 to 6 carbon atoms. Analogously, "alkenyloxy" and "lower alkenyloxy" respectively refer to an alkenyl and lower alkenyl group bound through a single, terminal ether linkage, and "alkynyloxy" and "lower alkynyloxy" respectively refer to an alkynyl and lower alkynyl group bound through a single, terminal ether linkage.

The term "aryl" as used herein, and unless otherwise specified, refers to an aromatic moiety containing 1 to 5 aromatic rings. For aryl groups containing more than one aromatic ring, the rings may be fused or linked. Aryl groups are optionally substituted with one or more inert, nonhydrogen substituents per ring; suitable "inert, nonhydrogen" substituents include, for example, halo, haloalkyl (preferably halo-substituted lower alkyl), alkyl (preferably lower alkyl), alkoxy (preferably lower alkoxy), and the like. Unless otherwise indicated, the term "aryl" is also intended to include heteroaromatic moieties, i.e., aromatic heterocycles. Generally, although not necessarily, the heteroatoms will be nitrogen, oxygen, or sulfur.

The term "fluorinated" refers to replacement of a hydrogen atom in a molecule or molecular segment with a fluorine atom. The term "fluoroalkyl" refers to an alkyl group wherein at least one hydrogen atom has been replaced with a fluorine atom and includes, for example, trifluoromethyl, difluoromethyl, 2,2,2-trifluoroethyl, pentafluoroethyl, 3,3,3-trifluoropropyl, etc. Similarly, the term "fluorocarbinol" refers to an alcohol moiety in which at least one of the hydrogen atoms bonded to a carbon atom has been replaced with a fluorine atom, and includes, for example, —CF$_2$OH, —CH(CF$_3$)—OH, —C(CF$_3$)$_2$—OH, —CH$_2$CF$_2$OH, etc. The term "fluoroacid" refers to a carboxylic acid substituent in which at least one of the hydrogen atoms bonded to a carbon atom has been replaced with a fluorine atom, and includes, for example, —CF$_2$COOH, —CH(CF$_3$)—COOH, —C(CF$_3$)$_2$—COOH, —CH$_2$CF$_2$COOH, etc. The term "perfluorinated" is used in its conventional sense to refer to a molecule or molecular segment wherein all hydrogen atoms are replaced with fluorine atoms. Unless otherwise indicated, "fluorinated" substituents (such as fluoroalkyl and the like) include perfluorinated substituents.

The term "polymer" is used to refer to a chemical compound that comprises linked monomers, and that may be linear, branched, or crosslinked. The polymer may be a homopolymer or a copolymer.

The terms "photogenerated acid" and "photoacid" are used interchangeably herein to refer to the acid that is created upon exposure of the present compositions to radiation, i.e., as a result of the radiation-sensitive acid generator in the compositions.

The term "substantially homogeneous" is used to describe a mixture of at least two polymers that have been blended so that each polymer exists as a continuous phase with the other as opposed to one of the polymers existing in a dispersed phase.

The term "substantially transparent," as used to describe a polymer that is "substantially transparent" to radiation of a particular wavelength, refers to a polymer that has an absorbance of less than about 5.0/$\mu$m, preferably less than about 4.0/$\mu$m, most preferably less than about 3.5/$\mu$m, at the selected wavelength.

For additional information concerning terms used in the field of lithography and lithographic compositions, reference may be made to Thompson et al., Eds., *Introduction to Microlithography* (Washington, D.C.: American Chemical Society, 1994).

The Substantially Homogeneous Polymer Blend

The substantially homogeneous polymer blend comprises a first polymer and a second polymer, the first polymer comprised of monomer units having the structure of formula (I):

(I)

wherein $R^1$, $R^2$ and L are as defined previously. Preferably, $R^1$ is $C_{1-12}$ alkyl or $C_{1-12}$ fluoroalkyl, $R^2$ is $C_{1-12}$ fluoroalkyl, and L is $C_{1-6}$ alkylene. Examples of suitable polymers include, but are limited to, poly (3-bicyclo[2.2.1]hept-2-yl-1,1,1-trifluoro-2-methyl-propan-2-ol), poly 2(-bicyclo[2.2.1]hept-2-yl-methyl-1,1,1-trifluoro-butan-2-ol), poly (2-bicyclo[2.2.1]hept-2-yl-methyl-1,1,1-trifluoro-3,3-dimethyl-butan-2-ol), poly (2-bicyclo[2.2.1]hept-2-yl-methyl-1,1,1,3,3,3-hexafluoro-propan-2-ol), and poly (1-bicyclo[2.2.1]hept-2-yl-4,4,4-trifluoro-2-methyl-butan-2-ol), and poly (4-bicyclo[2.2.1]hept-2-yl-1,1,1-trifluoro-2-methyl-butan-2-ol).

The second polymer may be any polymer that is suitable for use in a lithographic photoresist composition and is capable of forming a substantially homogeneous blend with the first polymer. Suitable polymers include, but are not limited to, those comprised of the following monomers: acrylic and methacrylic acid esters; vinyl aromatics; $C_5$–$C_{20}$, generally $C_7$–$C_{15}$, cyclic olefin monomers such as norbornene and tetracyclododecene; fluorinated analogs of any of the foregoing (e,g., fluorinated acrylic and methacrylic acid esters such as fluorinated alkyl acrylates, fluorinated aryl acrylates, fluorinated alkyl methacrylates, and fluorinated aryl methacrylates); and others readily apparent to one skilled in the art.

Preferred second polymers are copolymers comprised of a first monomer unit having the structure of formula (II):

(II)

wherein $R^3$, $R^{4a}$, $R^{4b}$ and $R^5$ are as defined previously. Preferably, $R^3$ is H, F, CN, CF$_2$H, CFH$_2$, CF$_3$, or CH$_3$, $R^{4a}$ and $R^{4b}$ are H or F, and $R^5$ is CN or COOR wherein R is selected from the group consisting of H, $C_{1-12}$ alkyl, and fluorinated $C_{1-12}$ alkyl, or is selected so as to render $R^3$ acid-cleavable, and a second monomer unit selected from the group consisting of:

wherein $R^1$, $R^2$, L, and $R^6$ through $R^9$ are as defined above. Preferred substituents are as follows: $R^1$ is $C_{1-12}$ alkyl or $C_{1-12}$ fluoroalkyl; $R^2$ is $C_{1-12}$ fluoroalkyl; $R^6$ is H, $C_{1-12}$ alkyl, or $C_{3-15}$ alicyclic; $R^7$ is $C_{1-12}$ alkyl, $C_{1-12}$ alkyl substituted with 1–12 fluorine atoms and 0–2 hydroxyl groups, or $C_{3-15}$ alicyclic, or $R^6$ and $R^7$ or $R^6$ and $R^8$ together form a five-, six-, or seven-membered ring; $R^8$ is H, $C_{1-12}$ alkyl, or $C_{1-12}$ fluoroalkyl; and $R^9$ is H, $C_{1-12}$ alkyl, or $C_{1-12}$ fluoroalkyl, or $R^7$ and $R^9$ together represent —X—$(CR^{10}R^{11})_n$—, in which case $R^6$ and $R^8$ are H, X is O or $CH_2$, n is 1 or 2, $R^{10}$ and $R^{11}$ are H, $C_{1-12}$ alkyl, or $C_{1-12}$ fluoroalkyl, or together may form an oxo moiety (=O), with the proviso that when $R^{10}$ and $R^{11}$ together form =O, n is 1, and L is $C_{1-6}$ alkylene. In a particularly preferred embodiment, when $R^5$ is CN, then $R^3$ is $CF_3$ and $R^{4a}$ and $R^{4b}$ are H.

Preferred first monomers units have an acid-cleavable pendent group as the $R^5$ substituent, which undergoes a cleavage reaction in the presence of photogenerated acid to generate a carboxylic acid group. Typically, the reaction of acid-cleavable functional groups with photogenerated acid occurs only, or is promoted greatly by, the application of heat to the film. Those skilled in the art will recognize the various factors that influence the rate and ultimate degree of cleavage of acid-cleavable functional groups as well as the issues surrounding integration of the cleavage step into a viable manufacturing process. The product of the cleavage reaction is a polymer-bound acid group, which, when present in sufficient quantities along the copolymer backbone, imparts solubility to the polymer in basic aqueous solutions.

When selected to render the $R^5$ moiety acid-cleavable, R is preferably either tertiary alkyl (e.g., t-butyl) or a cyclic or alicyclic substituent (generally $C_7$–$C_{12}$) with a tertiary attachment point such as 2-methyl-2-adamantyl, 2-methyl-2-isobornyl, 2-methyl-2-tetracyclododecenyl, 2-methyl-2-dihydrodicyclopentadienyl-cyclohexyl, or 1-methylcyclohexyl. Other suitable acid-cleavable protecting groups may be found in U.S. Pat. No. 5,679,495 to Yamachika et al. or in the pertinent literature and texts (e.g., Greene et al., *Protective Groups in Organic Synthesis*, 2$^{nd}$ Ed. (New York: John Wiley & Sons, 1991)).

The substantially homogeneous polymer blend may serve either as a base-soluble component of an unexposed resist or as an acid-labile component of a resist, i.e., a component that releases acid following irradiation, by virtue of the photo-acid generator in the resist composition and the acid-cleavable pendent groups on the copolymer, either in the $R^5$ substituent in a monomer unit having structure (II) or in a comonomer (e.g., the comonomer could be t-butyl methacrylate, or an alternative comonomer containing an acid-cleavable pendent group). Alternatively, or in addition, acid-cleavable pendant moieties may be present on a separate polymer that is admixed with the copolymer in the resist composition.

The polymers in the substantially homogeneous polymer blend may additionally comprise different monomer units having structural formula (I), (II), (III), or (IV), or other monomers, preferably vinyl monomers, for example to enhance the performance of the photoresist. Thus, the polymers in the substantially homogeneous polymer blend may comprise minor amounts of acrylic acid or methacrylic acid monomer (e.g., 5–30%) to enhance development. The polymers in the substantially homogeneous polymer blend may also comprise other suitable monomer units such as hydroxystyrene to enhance development and etch resistance, or a silicon-containing monomer unit (e.g., a silicon-containing acrylate, methacrylate, or styrene) to enhance oxygen plasma etch resistance for bilayer applications. Also, the substantially homogeneous polymer blend may comprise additional polymers or copolymers that may or may not have monomer units having structural formula (I), (II), (III), or (IV).

In general, suitable comonomers include, but are not limited to, the following ethylenically unsaturated polymerizable monomers: acrylic and methacrylic acid esters and amides, including alkyl acrylates, aryl acrylates, alkyl methacrylates and aryl methacrylates (for example, methyl acrylate, methyl methacrylate, n-butyl acrylate, n-butyl methacrylate, t-butyl acrylate, t-butyl methacrylate, 2-ethylhexyl methacrylate, benzyl acrylate and N-phenylacrylamide); vinyl aromatics, including unsubstituted styrene and styrene substituted with one or two lower alkyl, halogen or hydroxyl groups (for example, styrene derivatives such as 4-vinyltoluene, 4-vinylphenol, α-methylstyrene, 2,5-dimethylstyrene, 4-t-butylstyrene and 2-chlorostyrene); butadiene; vinyl acetate; vinyl bromide; vinylidene chloride; and $C_5$–$C_{20}$, generally $C_7$–$C_{15}$, cyclic olefin monomers such as norbornene and tetracyclododecene; fluorinated analogs of any of the foregoing (e.g., fluorinated acrylic and methacrylic acid esters such as fluorinated alkyl acrylates, fluorinated aryl acrylates, fluorinated alkyl methacrylates, and fluorinated aryl methacrylates); and others readily apparent to one skilled in the art. For use in 157 nm lithography, fluorinated comonomers are preferred.

Particularly preferred substantially homogeneous polymer blends utilize a homopolymer of bicyclo[2.2.1]hept-5-ene-2-(1,1,1-trifluoro-2-trifluoromethylpropan-2-ol) (PNBHFA) as the first polymer. PNBHFA produced with a Pd catalyst and post-treated is a highly transparent polymer at 193 nm (0.037/μm) and at 157 nm (1.7/μm), and substantially homogeneous polymer blends using PNBHFA, such as PNBHFA blended with P(TBTFMA-NBHFA), provide highly transparent resist compositions. Other copolymers that are particularly suitable for blending with PNBHFA include, but are not limited to, P(TBTFMA-NBHFA), P(TBMA-STHFA), and PTBMA and TBTFMA copolymers with vinylene carbonate and certain vinyl ethers such as dihydrofuran.

The inclusion ratio of first polymer to second polymer in the substantially homogenous polymer blend ranges from approximately 1:4 to approximately 4:1 and more preferably from approximately 1:2 to approximately 3:1. The exact ratio of first polymer to second polymer, as will be appreciated by one of skill in the art, depends upon the relative hydrophilicity, optical density, and miscibility of the polymers utilized as well as any other additives used. The optical density (OD) reduction and lipophilicity/hydrophilicity balancing are significant advantages of the present invention.

For example, copolymers of TBMA and STHFA developed for 157 nm $F_2$ excimer laser lithography have an optical density (OD) of 4.0–4.2/$\mu$m at 157 nm, which is not low enough to allow use of the copolymer poly (t-butyl methylacrylate-4-(1-hydroxy-2,2,2-trifluoro-1-trifluoromethyl)ethylstyrene) (PF-ESCAP) in 157 nm single layer imaging. Reduction of the optical density of PF-ESCAP through terpolymerization has not been successful. It has been found, however, that the PF-ESCAP copolymer blends homogeneously with PNBHFA and inhibits dissolution of PNBHFA in an industry-standard aqueous base. The blend film has an OD of 3.0–2.5/$\mu$m at 157 nm and can be employed in the formulation of single layer chemically amplified resists for 157 nm lithography.

Monomer Synthesis and Polymerization

Polymers suitable for use in the substantially homogeneous polymer blend may be readily synthesized using methods described in the pertinent texts and literature, or as otherwise known to those of ordinary skill in the art. Methods for synthesizing representative copolymers are described in the Examples.

Copolymers of the invention can be prepared by radical copolymerization, using a suitable free radical initiator. Radical polymerization is easy to run, economical, and highly suited for preparation of resist polymers. The initiator may be any conventional free radical-generating polymerization initiator. Examples of suitable initiators include peroxides such as O-t-amyl-O-(2-ethylhexyl) monoperoxycarbonate, dipropylperoxydicarbonate, and benzoyl peroxide (BPO), as well as azo compounds such as azobisisobutyronitrile (AIBN), 2,2'-azobis(2-amidinopropane)dihydrochloride, 2,2'-azobis(isobutyramide) dihydrate, 2,2'-azobis(2-methylbutyronitrile), dimethyl 2,2'-azobisisobytyrate, and dimethyl azobis(2-methylpropionate) (availiable as V-601 from Wako Pure Chemical Industries, Ltd.) The initiator is generally present in the polymerization mixture in an amount of from about 0.2 to 20 mole % relative to the monomers. With radical polymerization, the resulting copolymer typically has a number average molecular weight in the range of approximately 2,000 to 500,000, generally in the range of approximately 2,000 to 300,000.

The Photoacid Generator

The second component of the resist composition is a photoacid generator ("PAG"). Upon exposure to radiation, the photoacid generator generates a strong acid. A variety of photoacid generators can be used in the composition of the present invention. The photosensitive acid generators used in the photoresist compositions of the invention may be any suitable photosensitive acid generator known in the photoresist art that is compatible with the other components of the photoresist composition. Examples of preferred photoresist acid generators (PAGs) include: $\alpha$-(trifluoromethylsulfonyloxy)-bicyclo[2.2.1]hept-5-ene-2, 3-dicarboximide (MDT), onium salts, aromatic diazonium salts, sulfonium salts, diaryliodonium salts, and sulfonic acid esters of N-hydroxyamides or -imides, as disclosed in U.S. Pat. No. 4,731,605. Also, a PAG that produces a weaker acid, such as dodecane sulfonate of N-hydroxynaphthalimide (DDSN), may be used. Combinations of PAGs may be used.

Generally, suitable acid generators have a high thermal stability (preferably to temperatures greater than 140° C.) so they are not degraded during pre-exposure processing. In addition to MDT and DDSN, suitable PAGs include other sulfonate compounds as well as sulfonated esters and sulfonyloxy ketones. See U.S. Pat. No. 5,344,742 to Sinta et al., and *J. Photopolymer Science and Technology* 4:337–340, 1991, for disclosure of suitable sulfonate PAGs, including benzoin tosylate, t-butylphenyl $\alpha$-(p-toluenesulfonyloxy)-acetate, and t-butyl $\alpha$-(p-toluenesulfonyloxy)-acetate.

Onium salts are also generally preferred acid generators of compositions of the invention. Onium salts that contain weakly nucleophilic anions have been found to be particularly suitable. Examples of such anions are the halogen complex anions of divalent to heptavalent metals or nonmetals, for example, Sb, B, P, and As. Examples of suitable onium salts are aryl-diazonium salts, halonium salts, aromatic sulfonium and sulfoxonium salts, and selenium salts (e.g., triarylsulfonium and diaryliodonium hexafluoroantimonates, hexafluoroarsenates, and trifluoromethanesulfonates). Examples of preferred onium salts can be found in U.S. Pat. Nos. 4,442,197, 4,603,101, and 4,624,912.

Other useful acid generators include the family of nitrobenzyl esters, and the s-triazine derivatives. Suitable s-triazine acid generators are disclosed, for example, in U.S. Pat. No. 4,189,323.

Still other suitable acid generators include, without limitation, N-camphorsulfonyloxynaphthalimide; N-pentafluorophenylsulfonyloxynaphthalimide; ionic iodonium sulfonates (e.g., diaryl iodonium (alkyl or aryl) sulfonate and bis-(di-t-butylphenyl)iodonium camphanylsulfonate); ionic iodonium perfluoroalkanesulfonates (such as di-(4-t-butylphenyl)iodonium perfluorooctane sulfonate, "IPFOS"); aryl (e.g., phenyl or benzyl) triflates and derivatives and analogs thereof (e.g., triphenylsulfonium triflate or bis-(t-butylphenyl)iodonium triflate); pyrogallol derivatives (e.g., trimesylate of pyrogallol); trifluoromethanesulfonate esters of hydroxyimides; $\alpha,\alpha'$-bissulfonyl-diazomethanes; sulfonate esters of nitro-substituted benzyl alcohols; naphthoquinone-4-diazides; and alkyl disulfones.

Other suitable photoacid generators are disclosed in Reichmanis et al. (1991), *Chemistry of Materials* 3:395, and in U.S. Pat. No. 5,679,495 to Yamachika et al. Additional suitable acid generators useful in conjunction with the compositions and methods of the invention will be known to those skilled in the art and/or are described in the pertinent literature.

The Resist Composition

The photoresist composition herein comprises both the substantially homogeneous polymer blend as described in detail above, and an acid generator, with the substantially homogeneous polymer blend representing up to about 99 wt. % of the solids included in the composition, and the photoacid generator representing approximately 0.5–10 wt. % of the solids contained in the composition. Other components and additives may also be present.

For example, a positive photoresist composition may include a dissolution inhibitor, and a negative photoresist composition will include a crosslinking agent. If dissolution inhibitors and crosslinking agents are present, they will typically represent in the range of about 1 wt. % to 40 wt. %, preferably about 5 wt. % to 30 wt. %, of the total solids.

Suitable dissolution inhibitors will be known to those skilled in the art and/or described in the pertinent literature. Preferred dissolution inhibitors have high solubility in the resist composition and the solvent used to prepare solutions of the resist composition (e.g., propylene glycol methyl ether acetate, or "PGMEA"), exhibit strong dissolution inhibition, have a high exposed dissolution rate, are substantially transparent at the wavelength of interest, exhibit a moderating influence on $T_g$, have strong etch resistance, and display good thermal stability (i.e., stability at temperatures of about 140 C. or greater). Suitable dissolution inhibitors include, but are not limited to, bisphenol A derivatives and carbonate derivatives (for example, bisphenol A derivatives wherein one or both hydroxyl moieties are converted to a t-butoxy substituent or a derivative thereof such as a t-butoxycarbonyl or t-butoxycarbonylmethyl group); fluorinated bisphenol A derivatives, such as $CF_3$-bisphenol A-$OCH_2(CO)$—O-tBu (6F-bisphenol A protected with a t-butoxycarbonylmethyl group); normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups; cyclic acetal groups such as tetrahydrofuranyl, tetrahydropyranyl, and 2-methoxytetrahydropyranyl groups; androstane-17-alkylcarboxylates and analogs thereof, wherein the 17-alkylcarboxylate at the 17-position is typically lower alkyl. Examples of such compounds include lower alkyl esters of cholic, ursocholic, and lithocholic acids, including methyl cholate, methyl lithocholate, methyl ursocholate, t-butyl cholate, t-butyl lithocholate, t-butyl ursocholate, and the like (see, e.g., Allen et al. (1995), *J. Photopolym. Sci. Technol.*, cited supra); hydroxyl-substituted analogs of such compounds (ibid.); and androstane-17-alkylcarboxylates substituted with one to three $C_1$–$C_4$ fluoroalkyl carbonyloxy substituents, such as t-butyl trifluoroacetyllithocholate (see, e.g., U.S. Pat. No. 5,580,694 to Allen et al.).

The crosslinking agent used in the photoresist compositions of the invention may be any suitable crosslinking agent known in the negative photoresist art that is otherwise compatible with the other selected components of the photoresist composition. The crosslinking agent preferably acts to crosslink the polymer component in the presence of a generated acid. Preferred crosslinking agents are glycoluril compounds such as tetramethoxymethyl glycoluril, methylpropyltetramethoxymethyl glycoluril, and methylphenyltetramethoxymethyl glycoluril, available under the POWDERLINK trademark from American Cyanamid Company. Other possible crosslinking agents include: 2,6-bis(hydroxymethyl)-p-cresol and others found in Japanese Laid-Open Patent Application (Kokai) No. 1-293339, as well as etherified amino resins, for example methylated or butylated melamine resins (N-methoxymethyl-or N-butoxymethyl-melamine respectively) or methylated/butylated glycolurils, for example as can be found in Canadian Patent No. 1 204 547. Combinations of crosslinking agents may be used.

The remainder of the resist composition is composed of a solvent and may additionally, if necessary or desirable, include customary additives such as dyes, sensitizers, additives used as stabilizers and acid-diffusion controlling agents, coating aids such as surfactants or anti-foaming agents, adhesion promoters, and plasticizers.

The choice of solvent is governed by many factors, including but not limited to the solubility and miscibility of resist components, the coating process, and safety and environmental regulations. Additionally, inertness to other resist components is desirable. It is also desirable that the solvent possess the appropriate volatility to allow uniform coating of films yet also allow significant reduction or complete removal of residual solvent during the post-application bake process. See, e.g., Thompson et al., Eds., *Introduction to Microlithography*, cited previously. In addition to the above components, the photoresist compositions of the invention generally include a casting solvent to dissolve the other components, so that the overall composition may be applied evenly on the substrate surface to provide a defect-free coating. Where the photoresist composition is used in a multilayer imaging process, the solvent used in the imaging layer photoresist is preferably not a solvent to the underlayer materials, otherwise unwanted intermixing may occur. Examples of suitable casting solvents include: ethoxyethylpropionate (EEP); a combination of EEP and γ-butyrolactone (GBL); PGMEA; and ethyl lactate, although the invention is not limited to any particular solvent. Solvents may generally be chosen from ether-, ester-, hydroxyl-, and ketone-containing compounds, or mixtures of these compounds. Examples of appropriate solvents include cyclopentanone, cyclohexanone, lactate esters such as ethyl lactate, alkylene glycol alkyl ether esters such as propylene glycol methyl ether acetate, alkylene glycol monoalkyl esters such as methyl cellosolve, and other solvents such as butyl acetate, 2-ethoxyethanol, and ethyl 3-ethoxypropionate. Preferred solvents include ethyl lactate, PGMEA, EEP, and their mixtures.

The above list of solvents is for illustrative purposes only and should not be viewed as comprehensive, nor should the choice of solvent be viewed as limiting the invention in any way. Those skilled in the art will recognize that any number of solvents or solvent mixtures may be used. Greater than 50 percent of the total mass of the resist formulation is typically composed of the solvent, preferably greater than 80 percent.

Other customary additives include dyes that may be used to adjust the optical density of the formulated resist, and sensitizers that enhance the activity of photoacid generators by absorbing radiation and transferring it to the photoacid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

A wide variety of compounds with varying basicity may be used as stabilizers and acid-diffusion controlling additives. They may include nitrogenous compounds such as aliphatic primary, secondary, and tertiary amines; cyclic amines such as piperidines, pyrimidines, and morpholines; aromatic heterocycles such as pyridines, pyrimidines, and purines; imines such as diazabicycloundecene; guanidines; imides; amides; and others. Ammonium salts may also be used, including ammonium, primary, secondary, tertiary, and quaternary alkyl- and arylammonium salts of alkoxides, including hydroxides, phenolates, carboxylates, aryl and alkyl sulfonates, sulfonamides, and others. Other cationic nitrogenous compounds including pyridinium salts and salts of other heterocyclic nitrogenous compounds with anions such as alkoxides, including hydroxides, phenolates, carboxylates, aryl and alkyl sulfonates, sulfonamides, and the like may also be employed. Surfactants may be used to improve coating uniformity, and include a wide variety of ionic and non-ionic, monomeric, oligomeric, and polymeric species.

Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo- and polyethyleneglycol ethers, cycloaliphatic esters, and non-acid reactive steroidally-derived materials may be used as plasticizers, if desired. However, neither the classes of compounds nor the specific compounds mentioned above are intended to be comprehensive and/or limiting. One versed in the art will recognize the wide spectrum of commercially available products that may be used to carry out the types of functions that these customary additives perform.

Typically, the sum of all customary additives will comprise less than 20 percent of the solids included in the resist formulation, preferably, less than 5 percent.

Use in Generation of Resist Images on a Substrate

The present invention also relates to a process for generating a resist image on a substrate comprising the steps of: (a) coating a substrate with a film comprising the resist composition of the present invention; (b) imagewise exposing of the film to radiation; and (c) developing the image. The first step involves coating the substrate with a film comprising the resist composition dissolved in a suitable solvent. Suitable substrates are ceramic, metallic, or semiconductive, and preferred substrates are silicon-containing, including, for example, silicon dioxide, silicon nitride, and silicon oxynitride. The substrate may or may not be coated with an organic anti-reflective layer prior to deposition of the resist composition. Alternatively, a bilayer resist may be employed wherein a resist composition of the invention forms an upper resist layer (i.e., the imaging layer), and the underlayer is comprised of a material that is highly absorbing at the imaging wavelength and compatible with the imaging layer.

Preferably, the surface of the substrate is cleaned by standard procedures before the film is deposited thereon. Suitable solvents for the composition are as described in the preceding section, and include, for example, cyclohexanone, ethyl lactate, and propylene glycol methyl ether acetate. The film can be coated on the substrate using art-known techniques such as spin or spray coating, or doctor blading. Preferably, before the film has been exposed to radiation, the film is heated to an elevated temperature of about 90–150° C. for a short period of time, typically on the order of about 1 minute. The dried film has a thickness of about 0.02 $\mu$m–5.0 $\mu$m, preferably about 0.05–2.5 $\mu$m, most preferably about 0.10 to 1.0 $\mu$m. In the second step of the process, the film is imagewise exposed to radiation. The radiation may be ultraviolet, electron beam, or x-ray. Ultraviolet radiation is preferred, particularly deep ultraviolet radiation having a wavelength of less than about 250 nm, e.g., 157 nm using an $F_2$ excimer laser. The radiation is absorbed such that the radiation-sensitive acid generator generates free acid, which with heating causes cleavage of the acid-cleavable pendent groups and formation of the corresponding acid. After the film has been exposed to radiation, the film may again be heated to an elevated temperature of about 90–150° C. for a short period of time, on the order of about 1 minute. It will be appreciated by those skilled in the art that the aforementioned description applies to a positive resist, and with a negative resist the exposed regions would typically be crosslinked by acid.

The third step involves development of the image with a suitable solvent. Suitable solvents include an aqueous base, preferably an aqueous base without metal ions such as the industry-standard developer tetramethylammonium hydroxide or choline. Because the fluorinated polymer of the resist composition is substantially transparent at 157 nm, the resist composition is uniquely suitable for use at that wavelength. However, the resist may also be used with other ultraviolet wavelengths, e.g., 193 nm and 248 nm, or with electron beam or x-ray radiation.

The pattern from the resist structure may then be transferred to the material of the underlying substrate. Typically, the transfer is achieved by reactive ion etching or by an alternative etching technique. Thus, the compositions of the invention and resulting resist structures can be used to create patterned material layer structures, such as metal wiring lines, holes for contacts or vias, insulation sections (e.g., damascene trenches for shallow trench isolation), trenches for capacitor structures, etc., as might be used in the design of integrated circuit devices. Accordingly, the process for making these features involves, after development with a suitable developer as above, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section. In the manufacture of integrated circuits, circuit patterns can be formed in the developed areas after resist development, by coating the substrate with a conductive material, e.g., a metallic material, using known techniques such as evaporation, sputtering, plating, chemical vapor deposition, or laser-induced deposition. Dielectric materials may also be deposited by similar means during the process of making circuits. Ions of inorganic elements such as boron, phosphorous, or arsenic can be implanted in the substrate to make p-doped or n-doped circuit transistors. Examples of such processes are disclosed in U.S. Pat. Nos. 4,855,017, 5,362,663, 5,429,710, 5,562,801, 5,618,751, 5,744,376, 5,801,094, and 5,821,469. Other examples of pattern transfer processes are described in Chapters 12 and 13 of Moreau, *Semiconductor Lithography, Principles, Practices, and Materials* (Plenum Press, 1988). It should be understood that the invention is not limited to any specific lithographic technique or device structure.

It is to be understood that while the invention has been described in conjunction with the preferred specific embodiments thereof, that the foregoing description as well as the examples that follow are intended to illustrate and not limit the scope of the invention. Other aspects, advantages, and modifications within the scope of the invention will be apparent to those skilled in the art to which the invention pertains.

All patents, patent applications, and publications mentioned herein are hereby incorporated by reference in their entireties.

Experimental

The following examples are put forth so as to provide those of ordinary skill in the art with a complete disclosure and description of how to prepare and use the compositions disclosed and claimed herein. Efforts have been made to ensure accuracy with respect to numbers (e.g., amounts, temperatures, etc.), but some errors and deviations should be accounted for. Unless indicated otherwise, parts are parts by weight, temperature is in degrees Celsius (° C.), and pressure is at or near atmospheric. Additionally, all starting materials were obtained commercially or synthesized using known procedures.

Abbreviations

The following abbreviations are used throughout the Experimental section.

| AIBN | 2,2'-Azobisisobutyronitrile |
|---|---|
| DHF | Dihydrofuran |
| EtOAc | Ethyl acetate |
| IPFOS | Di-(4-t-butylphenyl)iodonium perfluorooctanesulfonate |
| MTMFA | Methyl α-trifluoromethylacrylate |
| MCPTFMA | 1-Methylcyclopentyl-α-trifluoromethylacrylate |
| NBHFA | Bicyclo[2.2.1]hept-5-ene-2-(1,1,1-trifluoro-2-trifluoromethylpropan-2-ol) |
| PGMEA | Propylene glycol methyl ether acetate |
| PF-ESCAP | Poly (t-butyl methylacrylate-4-(1-hydroxy-2,2,2-trifluoro-1-trifluoromethyl)ethylstyrene) |
| QCM | Quartz crystal microbalance |
| STHFA | 4-(1-Hydroxy-2,2,2-trifluoro-1-trifluoromethyl)ethylstyrene |
| TBAH | Tetrabutylammonium hydroxide |
| TBTFMA | t-Butyl α-trifluoromethylacrylate |
| TFMAA | α-Trifluoromethylacrylic acid |
| TMAH | Tetramethylammonium hydroxide |
| VCARB | Vinylene carbonate |

Measurements

NMR spectra were recorded on Bruker AF250 ($^1$H and $^{13}$C) and Avance 400 ($^1$H, $^{13}$C, $^{19}$F) spectrometers. Gel permeation chromatography (GPC) was performed with a Waters Model 150 chromatograph equipped with six Styragel columns; measurements were made at 30 and 40° C. in THF (PMTFMA and copolymers). Combustion analyses were performed by Childers Laboratories, Milford, N.J., and by Chemical Analytical Services, University of California, Berkeley, Calif. The molecular weight values are relative to polystyrene standards. UV measurements of polymer films coated on $CaF_2$ substrates were performed at 157 nm on multiple thicknesses using a Varian Cary Model 400 spectrophotometer modified for measurements down to 140 nm in an $N_2$ atmosphere. A quartz crystal microbalance (QCM) was used to study the dissolution kinetics of the polymer films in aqueous TMAH solution (CD-26). The kinetics of radical copolymerization were monitored in situ at 70° C. by 300 MHz $^1$H NMR (Bruker AC300) using AIBN as the initiator and dioxane-$d_8$ as a polymerization and NMR solvent.

Materials

The α-trifluoromethylacrylic monomers and STHFA were prepared as described by Ito et al. (2001), "Novel Fluoropolymers for Use in 157 nm Lithography," J. Photopolym. Sci. Technol. 14:583–593, and NBHFA was prepared as described by Ito et al. (1998), "Synthesis and Evaluation of Alicyclic Backbone Polymers for 193 nm Lithography," ACS Symposium Series 706, "Micro- and Nano-Patterning Polymers," H. Ito, E. Reichmanis, O. Nalamasu, and T. Ueno, Eds., American Chemical Society, Washington, D.C., Chap. 16, p. 208. DHF and VCARB were purchased from Aldrich. 2,2'-Azobis(isobutyronitrile) (AIBN) obtained from Aldrich was purified by recrystallization from methanol. The polymerization solvent employed was ethyl acetate (EtOAc), PGMEA, or p-dioxane-$d_8$. PNBHFA was provided by BF Goodrich Company (now Promerus Electronic Materials).

EXAMPLE 1

Radical Copolymerization of TBTFMA with NBHFA

P(TBTFMA-NBHFA) was prepared by radical copolymerization of TBTFMA and NBHFA in bulk. A mixture of 19.667 g of TBTFMA, 27.783 g of NBHFA, and 1.309 g of AIBN was deaerated by bubbling $N_2$ through it for 30 min. The 1:1 mixture was then placed in an oil bath maintained at 60° C. under $N_2$. The oil bath was removed after 48 hrs and the solid content dissolved in acetone. The acetone solution was slowly poured into stirred hexane to precipitate the copolymer. The polymer was isolated by filtration, rinsed with hexane, and re-dissolved in acetone. After reprecipitation in hexane, the powdery polymer was isolated by filtration, rinsed with hexane, and dried in a vacuum oven at 60° C. overnight. The polymer yield was 46 wt %. The copolymer had a number-average molecular weight ($M_n$) of 9,200 and a weight-average molecular weight ($M_w$) of 13,300 according to gel permeation chromatography (GPC), and contained 58 mol % TBTFMA and 42 mol % NBHFA according to inverse-gated $^{13}$C NMR. When the feed ratio was TBTFMA/NBHFA=2/1 in a similar copolymerization, a copolymer containing 65 mol % TBTFMA was obtained in a 56 wt % yield.

EXAMPLE 2

Radical Copolymerization of TBMA with STHFA

P(TBMA-STHFA) (PF-ESCAP) was prepared by radical copolymerization with AIBN as the initiator. A 100 mL three-neck round-bottom flask was equipped with a magnetic stirrer, condenser with nitrogen bubbler, and temperature controlled heating mantle. The flask was charged with 15 g of STHFA (0.0528 mol) (containing ca 5 wt % THF), 4.26 g (0.0299 mol) of TBMA, and 48 mL of ethyl acetate. The reaction was nitrogen flushed and heated to 70° C., then 561 mg (3.42 mmol) of AIBN was added, the reaction again nitrogen flushed, and heated overnight at reflux. The reaction mixture was cooled to room temperature then precipitated in 2500 mL hexane. The solid product was collected by filtration and washed with three 200 mL portions of hexane. After drying overnight under high vacuum 17.6 grams of polymer was obtained. Mw=12,800. Tg=135° C.

EXAMPLE 3

Radical Copolymerization of TBTFMA with DHF

A mixture of TBTFMA (9.81 g), DHF (3.51 g), and AIBN (0.6572 g) was deaerated and heated at 60° C. under $N_2$ for 23 hrs. The product was dissolved in acetone and precipitated in methanol/water. The isolated polymer was dissolved in acetone, precipitated again in methanol/water, and recovered by filtration. The polymer was dried at 50° C. in a vacuum oven overnight. The copolymer, obtained in an 82% yield, had $M_n$ of 2,700 and $M_w$ of 4,100, respectively. The composition was TBTFMA/DHF=58/42.

EXAMPLE 4

Radical Copolymerization of TBTFMA with VCARB

A deaerated mixture of TBTFMA (9.82 g), VCARB (4.34 g), and AIBN (0.6562 g) was heated at 60° C. under $N_2$ for 24 hrs. The product was dissolved in acetone and poured into methanol/water. The precipitated polymer was isolated by filtration and precipitated again in acetone. The polymer was precipitated into hexanes this time, isolated, washed with hexanes, and dried at 50° C. in a vacuum oven overnight. The copolymer, obtained in a 23% yield, had a composition of TBTFMA/VCARB=57/43. The $M_n$ and $M_w$ were 6,000 and 10,000, respectively.

EXAMPLE 5

Homogeneous Polymer Blend of PF-ESCAP with PNBHFA

Figure 1:
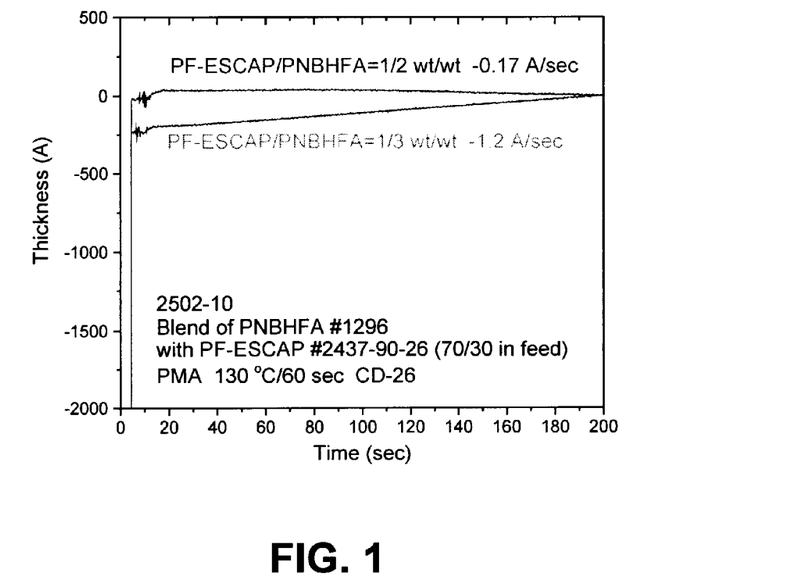
FIG. 1 is a graph illustrating the kinetics of polymer blend film dissolution as described in Example 5.

PF-ESCAP (TBMA/STHFA=69/31 in copolymer, prepared as discussed in Example 2) was blended with PNBHFA ($M_n$=12,600, $M_w$=20,300) at 1:2 and 1:3 wt ratios in PGMEA. PNBHFA was prepared at the BF Goodrich Company by Pd-mediated addition polymerization of NBHFA, and had $M_n$=12,600 and $M_w$=20,300. The dissolution rate of the PNBHFA in CD-26 was 4,465 A/sec. The films cast from the blend solution and baked at 130° C. for 60 sec were subjected to QCM analysis to study the kinetics of the blend film dissolution in a 0.26 N TMAH aqueous solution (CD-26), as shown in FIG. 1. The 1:2 blend film did not dissolve (only insignificant swelling of 0.17 A/sec) in the industry-standard developer, and the 1:3 blend film swelled only a little (1.19 A/sec), whereas PNBHFA by itself dissolved rapidly at 4,465 A/sec in CD-26. The results of the QCM study clearly suggest that the blend films are homogeneous without phase separation, and indicate that PF-ESCAP is a strong dissolution inhibitor of PNBHFA. The 1:2 and 1:3 blend films contained only 30 and 23.5 mol % of lipophilic TBMA.

EXAMPLE 6

Water Contact Angles for the Copolymers and Their Blends with PNBHFA

Table 1 summarizes water contact angles for the copolymers and their blends with PNBHFA, to demonstrate the effect of PNBHFA addition on reduction of the contact angle (increase in hydrophilicity and wettability with aqueous developer). The films were baked at 130° C. for 60 sec before the measurement.

TABLE 1

CONTACT ANGLES ($H_2O$) FOR COPOLYMERS AND BLENDS WITH PNBHFA

| POLYMER | BLEND RATIO (WT/WT) | CONTACT ANGLE |
|---|---|---|
| P(MCPTFMA-NBHFA) | 1/0 | 80.6–81.2 |
| P(MCPTFMA-NBHFA)/PNBHFA | 1/2 | 69.3–69.7 |
| P(TBTFMA-DHF) | 1/0 | 88.1–88.6 |
| P(TBTFMA-DHF)/PNBHFA | 1/2 | 77.2–77.8 |

EXAMPLE 7

Effect of Blend Composition on Transparency at 157 nm

Figure 2:
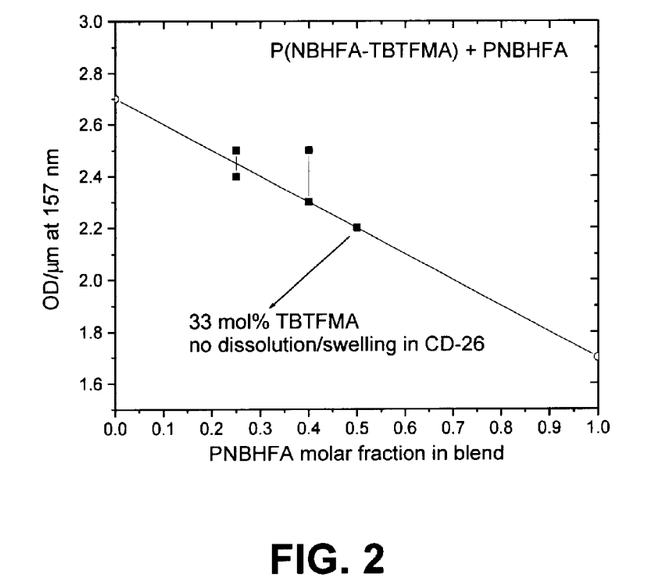
FIG. 2 is a graph depicting the relationship between optical density/μm at 157 nm relative to the molar fraction of PNBHFA for a P(NBHFA-TBTFMA)/PNBHFA polymer blend, as evaluated in Example 7. The optical density (OD) of this copolymer is about 2.7, which is reduced to about 2.2 by blending with two parts of PNBHFA.

Blends of PNBHFA and P(NBHFA-TBTFMA) were prepared at different molar rations of PNBHFA: 0.25, 0.4, and 0.5. The optical density of each blend was measured, and the molar fraction of PNBHFA and optical density determined. Results are shown in FIG. 2.

PF-ESCAP/PNBHFA blends are likely to have low OD of 3.0–2.5/$\mu$m at 157 nm. In fact, the measured ODs of the 1:3 and 1:2 blends were 2.8–2.9/$\mu$m and 3.0/$\mu$m, respectively, a significant improvement from 4.2/$\mu$m of imageable PF-ESCAP and even better than $PF^2$-ESCAP (3.2–3.6/$\mu$m.)

A TBTFMA-DHF copolymer with OD=3.8/$\mu$m can be rendered much more transparent (2.6/$\mu$m) by blending it with 2 parts of PNBHFA. Similarly, the OD of the TBTFMA-VCARB copolymer (4.2–4.5/$\mu$m) can be reduced to 3.2/$\mu$m by 1:2 blending with PNBHFA.

EXAMPLE 8

Figure 3:
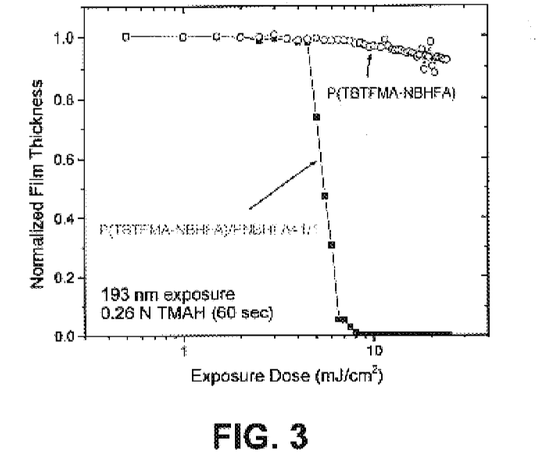
FIG. 3 is a graph illustrating the difference in development between a P(TBTFMA-NBHFA) copolymer resist and a blend resist of a 1:1 mixture of P(TBTFMA-NBHFA) and PNBHFA, as described in Example 8.

Comparison of P(TBTFMA-NBHFA) Copolymer Resist and a Blend Resist of a 1:1 Mixture of P(TBTFMA-NBHFA) and PNBHFA A P(TBTFMA-NBHFA) copolymer resist and a blend resist consisting of a 1:1 mixture of P(TBTFMA-NBHFA) and PNBHFA were each prepared in PGMEA using IPFOS (4 parts). The resist films were exposed to 193 nm radiation, baked at 140° C. for 90 sec, and developed with a 0.26 N TMAH aqueous solution for 60 sec. While the exposed/baked copolymer resist film did not dissolve at all in the developer even at high doses (25 mJ/$cm^2$) (although acid-catalyzed deprotection to convert the t-butyl ester to carboxylic acid had occurred, judging from the observed thickness loss (ca. 10%)), the blend resist developed to the substrate cleanly at about 8 mJ/$cm^2$. The blending with PNBHFA provided hydrophilicity/wettability and good aqueous base development. The results of this comparison are graphically represented in FIG. 3.

EXAMPLE 9

Resist Formation Using P(NBHFA-TBTFMA) and PNBHFA Polymer Blend

Figure 4:
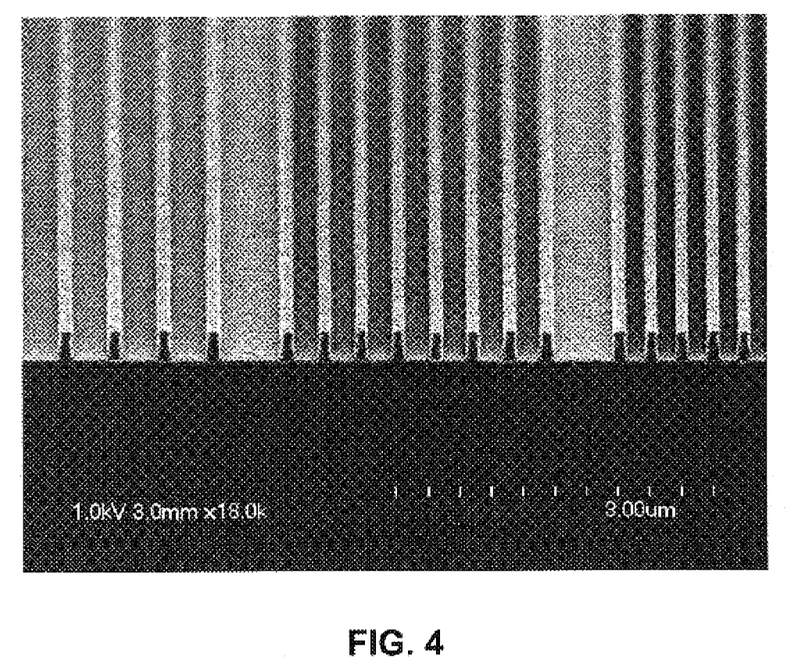
FIG. 4 is a scanning electron micrograph of the resist prepared in Example 9.
Figure 5:
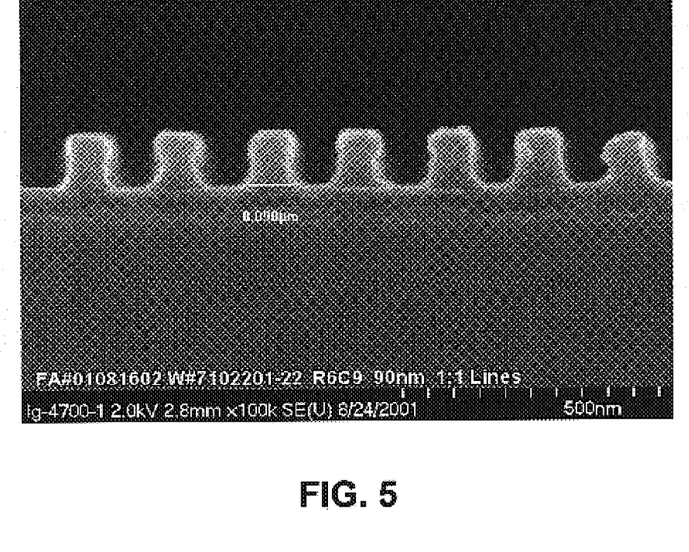
FIG. 5 is a scanning electron micrograph of 90 nm 1:1 line/space patterns printed with the blend resist prepared in Example 9 using an Exitech 157 nm pulsed laser system with a phase shift mask.

A resist formulation was made by mixing P(NBHFA-TBTFMA) and PNBHFA at a 44/56 ratio in PGMEA. Di-(4-t-butylphenyl)iodonium perfluorooctanesulfonate (4 parts) and tetrabutylammonium hydroxide (TBAH, 0.2 parts) were added to the polymer solution. No dissolution-modifying agent was employed in the formulation. Post-apply and post-exposure bake (PAB and PEB) conditions were 130° C./60 sec and 140° C./60 sec, respectively. An SEM photo of the resist developed using an ISI 193 nm pulsed laser system is included as FIG. 4. FIG. 5 is an SEM photo of 90 nm 1:1 lines/space patterns printed with the resist formulation using a Exitech 157 nm pulsed laser system and a phase shift mask.

EXAMPLE 10

Resist Formation Using P(TBTFMA-DHF) and PNBHFA Polymer Blend

Figure 6:
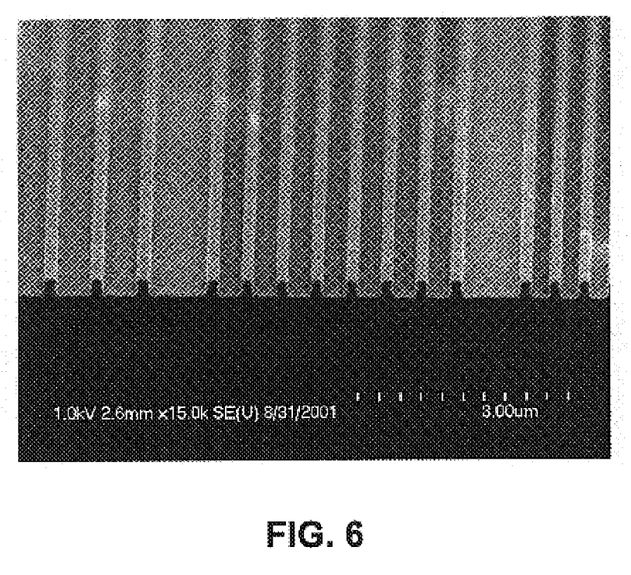
FIG. 6 is scanning electron micrograph of a positive resist image made using a TBTFMA-DHF copolymer blended with 2 parts of PNBHFA and printed using a 193 nm pulsed laser system, as described in Example 10. Di-(4-t-butylphenyl) iodonium perfluorooctanesulfonate was used as the photoacid generator and tetramethylammonium hydroxide was used as the base developer.

A resist formulation was made by mixing P(TBTFMA-DHF) and PNBHFA at a 1:2 ratio in PGMEA. Di-(4-t-butylphenyl)iodonium perfluorooctanesulfonate (IPFOS, 4 parts) and tetrabutylammonium hydroxide (TBAH, 0.2 parts) were added to the polymer solution. No dissolution-modifying agent was employed in the formulation. Post-apply and post-exposure bake (PAB and PEB) conditions were 130° C./60 sec and 140° C./60 sec, respectively. An SEM photo of the developed resist using an ISI 193 nm pulsed laser system is presented in FIG. 6.

EXAMPLE 11

Resist Formation Using P(TBTFMA-VCARB) and PNBHFA Polymer Blend

Figure 7:
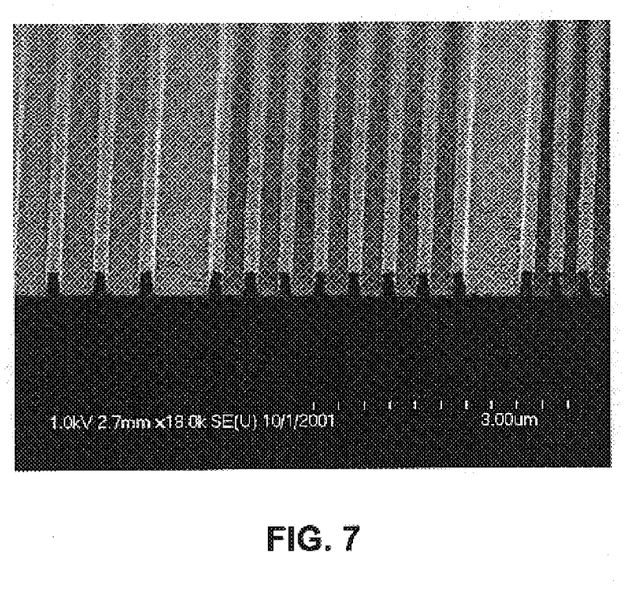
FIG. 7 is a scanning electron micrograph of a positive resist image made using a TBTFMA-VCARB copolymer blended with 1 part of PNBHFA and printed using a 193 nm pulses laser-system, as described in Example 11. Di(4-t-butylphenyl) iodonium perfluorooctanesulfonate was used as the photoacid generator and tetramethylammonium hydroxide was used as the base developer.

A resist formulation was made by mixing P(TBTFMA-VCARB) and PNBHFA at a 1:1 ratio in PGMEA. Di-(4-t-butylphenyl)iodonium perfluorooctanesulfonate (IPFOS, 4 parts) and tetrabutylammonium hydroxide (TBAH, 0.2 parts) were added to the polymer solution. No dissolution-modifying agent was employed in the formulation. Post-apply and post-exposure bake (PAB and PEB) conditions were 130° C./60 sec and 140° C./60 sec, respectively. An SEM photo of the developed resist using an ISI 193 nm pulsed laser system is included as FIG. 7.

We claim:

1. A substantially homogeneous polymer blend comprising a first polymer and a second polymer, the first polymer comprised of monomer units having the structure of formula (I):

wherein:
$R^1$ is $C_{1-12}$ alkyl or $C_{1-12}$ fluoroalkyl;
$R^2$ is $C_{1-12}$ fluoroalkyl; and
L is $C_{1-6}$ alkylene or $C_{1-6}$ fluoroalkylene,
wherein any carbon atom indicated as unsubstituted is optionally substituted with an inert, nonhydrogen substituent.

2. The substantially homogeneous polymer blend of claim 1, wherein the second polymer comprises a copolymer.

3. The substantially homogeneous polymer blend of claim 2, wherein the copolymer is comprised of: a first monomer unit having the structure of formula (II):

wherein
$R^3$ is H, F, CN, $C_{1-6}$ fluoroalkyl, -or $CH_3$, $R^{4a}$ and $R^{4b}$ are H or F,
$R^5$ is CN or COOR, wherein R is selected from the group consisting of H, $C_{1-12}$ alkyl and $C_{1-12}$ fluoroalkyl, or is selected so as to render $R^5$ acid-cleavable; and
a second monomer unit selected from the group consisting of:

wherein
$R^1$ and $R^2$ are as defined previously;
$R^6$ is H, $C_{1-12}$ alkyl, $C_{1-12}$ fluoroalkyl, $C_{3-15}$ alicyclic, or fluorinated $C_{3-15}$ alicyclic,
$R^7$ is $C_{1-12}$ alkyl, $C_{1-12}$ alkyl substituted with 1–12 fluorine atoms and 0–2 hydroxyl groups, $C_{3-15}$ alicyclic, or fluorinated $C_{3-15}$ alicyclic, or $R^6$ and $R^7$ together form a five-, six-, or seven-membered ring,
$R^8$ is H, $C_{1-12}$ alkyl, or $C_{1-12}$ fluoroalkyl, or $R^6$ and $R^8$ together form a five-, six-, or seven-membered ring,
$R^9$ is H, $C_{1-12}$ alkyl, or $C_{1-12}$ fluoroalkyl, or $R^7$ and $R^9$ together represents —X—$(CR^{10}R^{11})_n$—, in which case $R^6$ and $R^8$ are H, X is O or $CH_2$, and n is 1 or 2,
$R^{10}$ and $R^{11}$ are H, $C_{1-12}$ alkyl, or $C_{1-12}$ fluoroalkyl, or together form an oxo moiety (=O), with the proviso that when $R^{10}$ and $R^{11}$ together form =O, n is 1, and L is $C_{1-6}$, alkylene.

4. The substantially homogeneous polymer blend of claim 3, wherein $R^3$ is $CF_3$.

5. The substantially homogeneous polymer blend of claim 4, wherein $R^5$ is COOR.

6. The substantially homogeneous polymer blend of claim 5, wherein R is $C_{1-12}$ alkyl.

7. The substantially homogeneous polymer blend of claim 5, wherein R is selected to render $R^5$ acid-cleavable.

8. The substantially homogeneous polymer blend of claim 4, wherein $R^5$ is CN.

9. The substantially homogeneous polymer blend of claim 8, wherein $R^3$ is $CF_3$ and $R^{4a}$ and $R^{4b}$ are H.

10. The substantially homogeneous polymer blend of claim 3, wherein $R^3$, $R^{4a}$, and $R^{4b}$ are F and $R^5$ is COOR.

11. The substantially homogeneous polymer blend of claim 10, wherein R is $C_{1-12}$ alkyl.

12. The substantially homogeneous polymer blend of claim 10, wherein R is selected to render $R^5$ acid-cleavable.

13. The substantially homogeneous polymer blend of claim 12, wherein R is a tertiary alkyl substituent.

14. The substantially homogeneous polymer blend of claim 13, wherein R is t-butyl.

15. The substantially homogeneous polymer blend of claim 12, wherein R is a $C_3$–$C_{15}$ cyclic or alicyclic substituent with a tertiary attachment point.

16. The substantially homogeneous polymer blend of claim 15, wherein R is selected from the group consisting of adamantyl, norbornyl, isobornyl, 2-methyl-2-adamantyl, 2-methyl-2-isobornyl, 2-methyl-2-tetracyclododecenyl, 1-methylcyclopentyl, and 1-methylcyclohexyl.

17. The substantially homogeneous polymer blend of claim 3, wherein $R^3$ is CN, and $R^{4a}$ and $R^{4b}$ are H.

18. The substantially homogeneous polymer blend of claim 3, wherein the second monomer unit has the structure of formula (I).

19. The substantially homogeneous polymer blend of claim 3, wherein the second monomer unit has the structure of formula (III).

20. The substantially homogeneous polymer blend of claim 3, wherein the second monomer unit has the structure of formula (IV).

21. The substantially homogeneous polymer blend of claim 20, wherein the first polymer is selected from the group consisting of poly(2-bicyclo[2.2.1]hept-2-ylmethyl-1,1,1,3,3,3-hexafluoro-propan-2-ol), poly (3-bicyclo[2.2.1]hept-2-yl-1,1,1-trifluoro-2-methyl-propan-2-ol), poly 2(-bicyclo[2.2.1]hept-2-yl-methyl-1,1,1-trifluoro-butan-2-ol), poly (2-bicyclo[2.2.1]hept-2-yl-methyl-1,1,1-trifluoro-3,3-dimethyl-butan-2-ol), poly (1-bicyclo[2.2.1]hept-2-yl-4,4,4-trifluoro-2-methyl-butan-2-ol), and poly (4-bicyclo[2.2.1]hept-2-yl-1,1,1-trifluoro-2-methyl-butan-2-ol).

22. The substantially homogeneous polymer blend of claim 20, wherein the monomer unit having the structure (IV) is substituted with an inert nonhydrogen substituent.

23. The substantially homogeneous polymer blend of claim 22, wherein the inert nonhydrogen substituent is selected from the group consisting of F, $C_{1-12}$ alkyl, $C_{1-12}$ alkoxy, $C_{2-12}$ alkenyl, $C_{2-12}$ alkenyloxy, $C_{1-12}$ fluoroalkyl, $C_{1-12}$ fluoroalkoxy, and $C_{1-12}$ fluoroalkenyl, any of which substituents, with the exception of F, is optionally further substituted with an additional moiety.

24. The substantially homogeneous polymer blend of claim 23, wherein the additional moiety is a hydroxyl group.

25. The substantially homogeneous polymer blend of claim 23, wherein the inert nonhydrogen substituent is F.

26. The substantially homogeneous polymer blend of claim 1, wherein the polymer blend is substantially transparent to radiation having a wavelength of less than about 250 nm.

27. The substantially homogeneous polymer blend of claim 26, wherein the polymer blend is substantially transparent to radiation having a wavelength of less than about 193 nm.

28. The substantially homogeneous polymer blend of claim 27, wherein the polymer blend is substantially transparent to radiation having a wavelength of 157 nm.

29. The substantially homogeneous polymer blend of claim 3, wherein the copolymer further comprises at least one additional monomer unit that is different from the first and second monomer units.

30. The substantially homogeneous polymer blend of claim 3, wherein $R^3$ is H, F, CN, $CF_2H$, $CFH_2$, $CF_3$, or $CH_3$.

31. The substantially homogeneous polymer blend of claim 3, wherein the ratio of first polymer to second polymer is approximately 1:4 to approximately 4:1.

32. The substantially homogeneous polymer blend of claim 31, wherein the ratio of first polymer to second polymer is approximately 1:2 to approximately 3:1.

33. The substantially homogeneous polymer blend of claim 1, wherein the first polymer further comprises at least one additional monomer unit that does not have the structure of formula (I).

34. The substantially homogeneous polymer blend of claim 1, wherein at least one carbon atom indicated as unsubstituted is substituted with an inert nonhydrogen substituent.

35. The substantially homogenous polymer blend of claim 34, wherein the inert nonhydrogen substituent is selected from the group consisting of F, $C_{1-12}$ alkyl, $C_{1-12}$ alkoxy, $C_{2-12}$ alkenyl, $C_{2-12}$ alkenyloxy, $C_{1-12}$ fluoroalkyl, $C_{1-12}$ fluoroalkoxy, and $C_{2-12}$ fluoroalkenyl, any of which substituents, with the exception of F, is optionally further substituted with an additional moiety.

36. The substantially homogeneous polymer blend of claim 35, wherein the additional moiety is hydroxyl group.

37. The substantially homogenous polymer blend of claim 1, wherein the first polymer is poly(bicyclo[2.2.1]hept-5-ene-2-(1,1,1-trifluoro-2-trifluoromethylpropan-2-ol)).

38. The substantially homogeneous polymer blend of claim 37, wherein the second polymer is selected from the group consisting of poly (t-butyl methylacrylate-4-(1-hydroxy-2,2,2-trifluoro-1-trifluoromethyl)ethylstyrene), poly (bicyclo[2.2.1]hept-5-ene-2-(1,1,1-trifluoro-2-trifluoromethylpropan-2-ol)-co-(t-butyl α-trifluoromethylacrylate)), poly ((t-butyl α-trifluoromethylacrylate)-co-(dihydrofuran)), and poly ((t-butyl α-trifluoromethylacrylate)-co-(vinylene carbonate)).

39. A lithographic photoresist composition comprising the substantially homogeneous polymer blend of claim 1 and a radiation-sensitive acid generator.

40. The lithographic photoresist composition of claim 39, wherein the lithographic photoresist composition is a positive resist and further comprises a photoacid-cleavable monomeric or polymeric dissolution inhibitor.

41. The lithographic photoresist composition of claim 39, wherein the lithographic photoresist composition is a negative resist and further comprises a crosslinking agent.

42. The lithographic photoresist composition of claim 41, wherein the crosslinking agent is a gycoluril compound.

43. The lithographic photoresist composition of claim 42, wherein the glycoluril compound is selected from the group consisting of tetramethoxymethyl glycoluril, methylpropyltetramethoxymethyl glycoluril, methylphenyltetramethoxymethyl glycoluril, and mixtures thereof.

44. A process for generating a resist image on a substrate, comprising:

(a) coating a substrate with a film of a photoresist comprised of a radiation-sensitive acid generator and substantially homogeneous polymer blend comprising:

(i) a first monomer unit having the structure of formula (II):

wherein

$R^3$ is H, F, CN, $C_{1-6}$ fluoroalkyl, or $CH_3$, $R^{4a}$ and $R^{4b}$ are H or F, $R^5$ is CN or COOR, wherein R is selected from the group consisting of H, $C_{1-12}$ alkyl and $C_{1-12}$ fluoroalkyl, or is selected so as to render $R^5$ acid-cleavable; and a second monomer unit selected from the group consisting of:

-continued (III)

(IV)

wherein
R¹ is $C_{1-12}$ alkyl or $C_{1-12}$ fluoroalkyl,
R² is $C_{1-12}$ fluoroalkyl,
R⁶ is H, $C_{1-12}$ alkyl, $C_{1-12}$ fluoroalkyl, $C_{3-15}$ alicyclic, or fluorinated $C_{3-15}$ alicyclic,
R⁷ is $C_{1-12}$ alkyl, $C_{1-12}$ alkyl substituted with 1–12 fluorine atoms and 0–2 hydroxyl groups, $C_{3-15}$ alicyclic, or fluorinated $C_{3-15}$ alicyclic, or R⁶ and R⁷ together form a five-, six-, or seven-membered ring,
R⁸ is H, $C_{1-12}$ alkyl, or $C_{1-12}$ fluoroalkyl, or R⁶ and R⁸ together form a five-, six-, or seven-membered ring,
R⁹ is H, $C_{1-12}$ alkyl, or $C_{1-12}$ fluoroalkyl, or R⁷ and R⁹ together represent —X—$(CR^{10}R^{11})_n$—, in which case R⁶ and R⁸ are H, X is O or $CH_2$, and n is 1 or 2,
R¹⁰ and R¹¹ are H, $C_{1-12}$ alkyl, or $C_{1-12}$ fluoroalkyl, or together form an oxo moiety (=O), with the proviso that when R¹⁰ and R¹¹ together form =O, n is 1, and L is $C_{1-6}$ alkylene, and
wherein any carbon atom indicated as unsubstituted is optionally substituted with an inert, nonhydrogen substituent; and
(ii) a second polymer comprised of monomer units having the structure (I);
(b) exposing the film selectively to a predetermined pattern of radiation so as to form a latent, patterned image in the film; and
(c) developing the latent image with a developer.

45. The process of claim 44, wherein R⁵ is CN, R³ is $CF_3$ and $R^{4a}$ and $R^{4b}$ are H.

46. The process of claim 44, wherein the second monomer unit has the structure of formula (I).

47. The process of claim 44, wherein the second monomer unit has the structure of formula (III).

48. The process of claim 44, wherein the second monomer unit has the structure of formula (IV).

49. The process of claim 44, wherein the polymer blend is substantially transparent to radiation having a wavelength of less than about 250 nm.

50. The process of claim 44, wherein the polymer blend is substantially transparent to radiation having a wavelength of less than about 193 nm.

51. The process of claim 44, wherein the polymer blend is substantially transparent to radiation having a wavelength of 157 nm.

52. A method of improving the aqueous base development of a lithographic photoresist composition, comprising: providing a polymer transparent to deep ultraviolet radiation and a radiation-sensitive acid generator; and incorporating into the lithographic photoresist composition an additional polymer comprised of a monomer unit having the structure of formula (I):

(I)

wherein R¹ is $C_{1-12}$ alkyl or $C_{1-12}$ fluoroalkyl, R² is $C_{1-12}$ fluoroalkyl, and L is $C_{1-6}$ alkylene or $C_{1-6}$ fluoroalkylene, and further wherein any carbon atom indicated as unsubstituted is optionally substituted with an inert, nonhydrogen substituent.

53. A method of reducing the optical absorption in the vacuum ultraviolet region of a lithographic photoresist composition comprising: providing a polymer transparent to deep ultraviolet radiation and a radiation-sensitive acid generator; and incorporating into the lithographic photoresist composition an additional polymer comprised of a monomer unit having the structure (I):

(I)

wherein R¹ is $C_{1-12}$ alkyl or $C_{1-12}$ fluoroalkyl, R² is $C_{1-12}$ fluoroalkyl, and L is $C_{1-6}$ alkylene or $C_{1-6}$ fluoroalkylene, and further wherein any carbon atom indicated as unsubstituted is optionally substituted with an inert, nonhydrogen substituent.

54. A method for preparing a copolymer comprised of monomer units having the structure (I):

(I)

and monomer units having the structure (II):

(II)

comprising copolymerizing, via direct free radical polymerization in the presence of a free radical initiator, a first monomer having the structure of formula (V):

(V)

wherein
$R^3$ is H, F, CN, $C_{1-6}$ fluoroalkyl, or $CH_3$, $R^{4a}$ and $R^{4b}$ are H or F,
$R^5$ is CN or COOR, wherein R is selected from the group consisting of H, $C_{1-12}$ alkyl and $C_{1-12}$ fluoroalkyl, or is selected so as to render $R^5$ acid-cleavable; and
a second monomer having the structure (VI):

(VI)

wherein $R^1$ is $C_{1-12}$ alkyl or $C_{1-12}$ fluoroalkyl, $R^2$ is $C_{1-12}$ fluoroalkyl, and L is $C_{1-6}$ alkylene or $C_{1-6}$ fluoroalkylene, and further wherein any carbon atom indicated as unsubstituted is optionally substituted with an inert, nonhydrogen substituent.

55. The method of claim 54, wherein the radical initiator is selected from the group consisting of O-t-amyl-O-(2-ethylhexyl)monoperoxycarbonate, dipropylperoxydicarbonate, benzoyl peroxide, 2,2'-azobis (2-amidino-propane)dihydrochloride, 2,2'-azobis (isobutyramide)dihydrate, dimethyl azobis(2-methylpropionate), 2,2'-azobisisobutyronitrile, 2,2'-azobis (2-methylbutyronitrile), dimethyl 2,2'-azobisisobytyrate, and mixtures thereof.

56. The method of claim 54, further comprising copolymerizing a third monomer selected from monomers having the structure of formula (VII) or formula (VIII):

(VII)

(VIII)

wherein
$R^1$ and $R^2$ are as defined previously,
$R^6$ is H, $C_{1-12}$ alkyl, $C_{1-12}$ fluoroalkyl, $C_{3-15}$ alicyclic, or fluorinated $C_{3-15}$ alicyclic,
$R^7$ is $C_{1-12}$ alkyl, $C_{1-12}$ alkyl substituted with 1–12 fluorine atoms and 0–2 hydroxyl groups, $C_{3-15}$ alicyclic, or fluorinated $C_{3-15}$ alicyclic, or $R^6$ and $R^7$ together form a five-, six-, or seven-membered ring,
$R^8$ is H, $C_{1-12}$ alkyl, or $C_{1-12}$ fluoroalkyl, or $R^6$ and $R^8$ together form a five-, six-, or seven-membered ring,
$R^9$ is H, $C_{1-12}$ alkyl, or $C_{1-12}$ fluoroalkyl, or $R^7$ and $R^9$ together represent $-X-(CR^{10}R^{11})_n-$, in which case $R^6$ and $R^8$ are H, X is O or $CH_2$, and n is 1 or 2,
$R^{10}$ and $R^{11}$ are H, $C_{1-12}$ alkyl, or $C_{1-12}$ fluoroalkyl, or together form an oxo moiety (=O), with the proviso that when $R^{10}$ and $R^{11}$ together form =O, n is 1, and L is $C_{1-6}$ alkylene.

57. The method of claim 54, wherein the direct free radical polymerization is direct bulk free radical polymerization.

58. The method of claim 54, wherein $R^5$ is CN, $R^3$ is $CF_3$ and $R^{4a}$ and $R^{4b}$ are H.

59. A substrate coated with a lithographic photoresist composition comprising the substantially homogeneous polymer blend of claim 1 and a radiation sensitive acid generator.

* * * * *